(12) United States Patent
Grinchuk

(10) Patent No.: US 6,701,499 B2
(45) Date of Patent: Mar. 2, 2004

(54) EFFECTIVE APPROXIMATED CALCULATION OF SMOOTH FUNCTIONS

(75) Inventor: Mikhail I. Grinchuk, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/308,557

(22) Filed: Dec. 3, 2002

(65) Prior Publication Data

US 2003/0237068 A1 Dec. 25, 2003

Related U.S. Application Data

(60) Provisional application No. 60/389,237, filed on Jun. 13, 2002.

(51) Int. Cl.[7] ............................................. G06F 9/45
(52) U.S. Cl. ................................... 716/7; 716/4; 716/5
(58) Field of Search ............................... 716/1, 2, 3, 4, 716/5, 6, 7, 8, 9, 18; 703/2, 14, 15, 17, 27

(56) References Cited

U.S. PATENT DOCUMENTS

| | | | |
|---|---|---|---|
| 6,212,669 B1 * | 4/2001 | Jain | 716/7 |
| 6,421,815 B1 * | 7/2002 | Seawright | 716/7 |
| 6,457,162 B1 * | 9/2002 | Stanion | 716/7 |
| 6,567,959 B2 * | 5/2003 | Levin et al. | 716/5 |
| 2002/0138812 A1 * | 9/2002 | Johannsen | 716/5 |

OTHER PUBLICATIONS

Forth et al. (An efficient Heuristic for state encoding Miniminzing the BDD Representations of the Transition Relations of Finite State Machines Jan. 25–28, 2001).*
Ashar et al. (Boolean Satisfiability and Equivalence Checking Using General Binary Decision Diagrams Oct. 14–16, 1991).*
Felt et al. (Dynamic Variable Reordering for BDD Minimization Sep. 20–24, 1993).*
Krohm el al. (The Use of Random Simulation in Formal Verification Oct. 7–9, 1996).*

* cited by examiner

Primary Examiner—Vuthe Siek
Assistant Examiner—Binh C. Tat
(74) Attorney, Agent, or Firm—Suiter-West PC LLO

(57) ABSTRACT

The present invention is directed to a system and method for effective approximation of smooth functions. In an aspect of the present invention, a method for approximating a smooth function for implementation in an integrated circuit design includes receiving a function f for computation with an accuracy of m bits by an integrated circuit. The function is computed based on an operator with one more output than the accuracy of m bits and a value of f' is determined by choosing from one of the at least two numbers computed utilizing the operator with one more output. The value may be chosen based on complexity issues in the construction of a binary decision diagram for use in designing the integrated circuit.

24 Claims, 4 Drawing Sheets

"Plain" BDD for Partial Operator G(f")

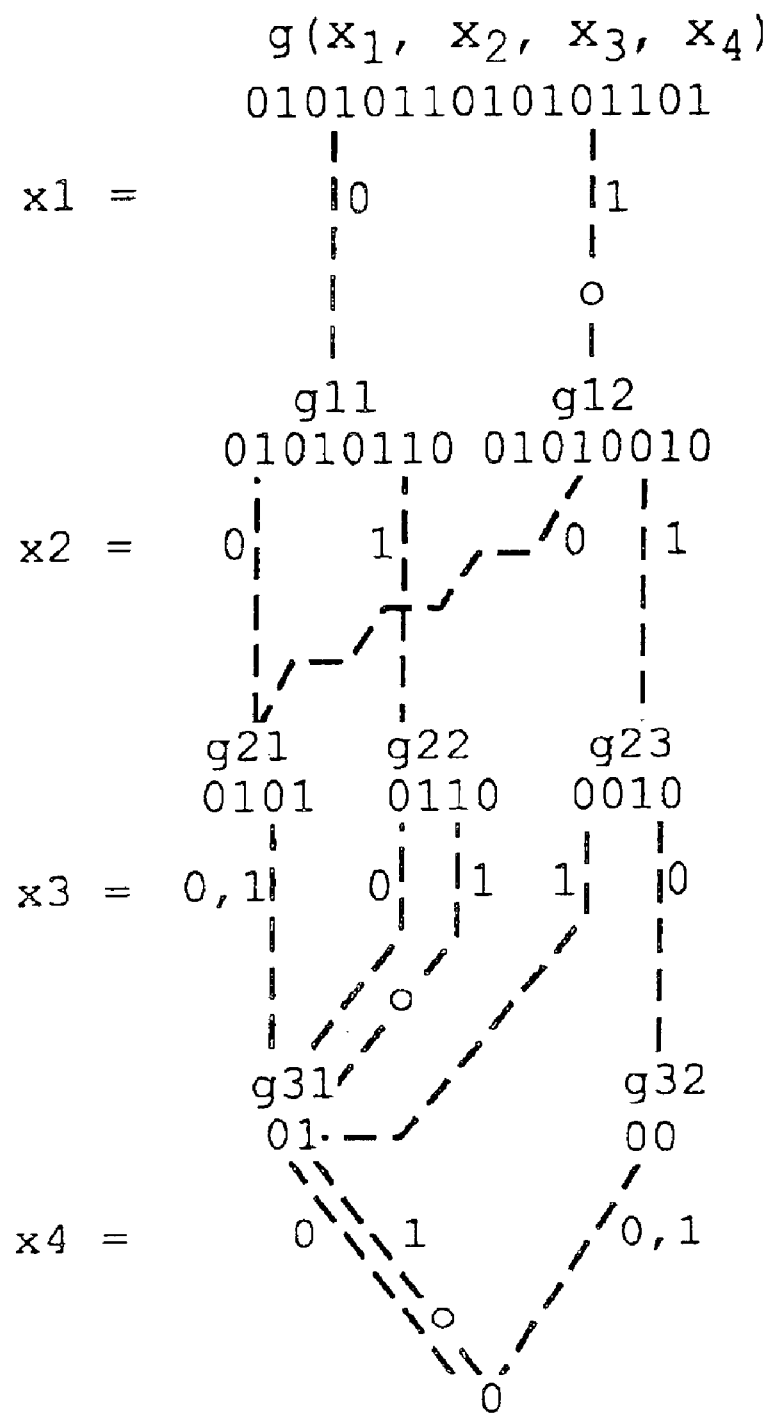
A Sample BDD
*FIG._1*

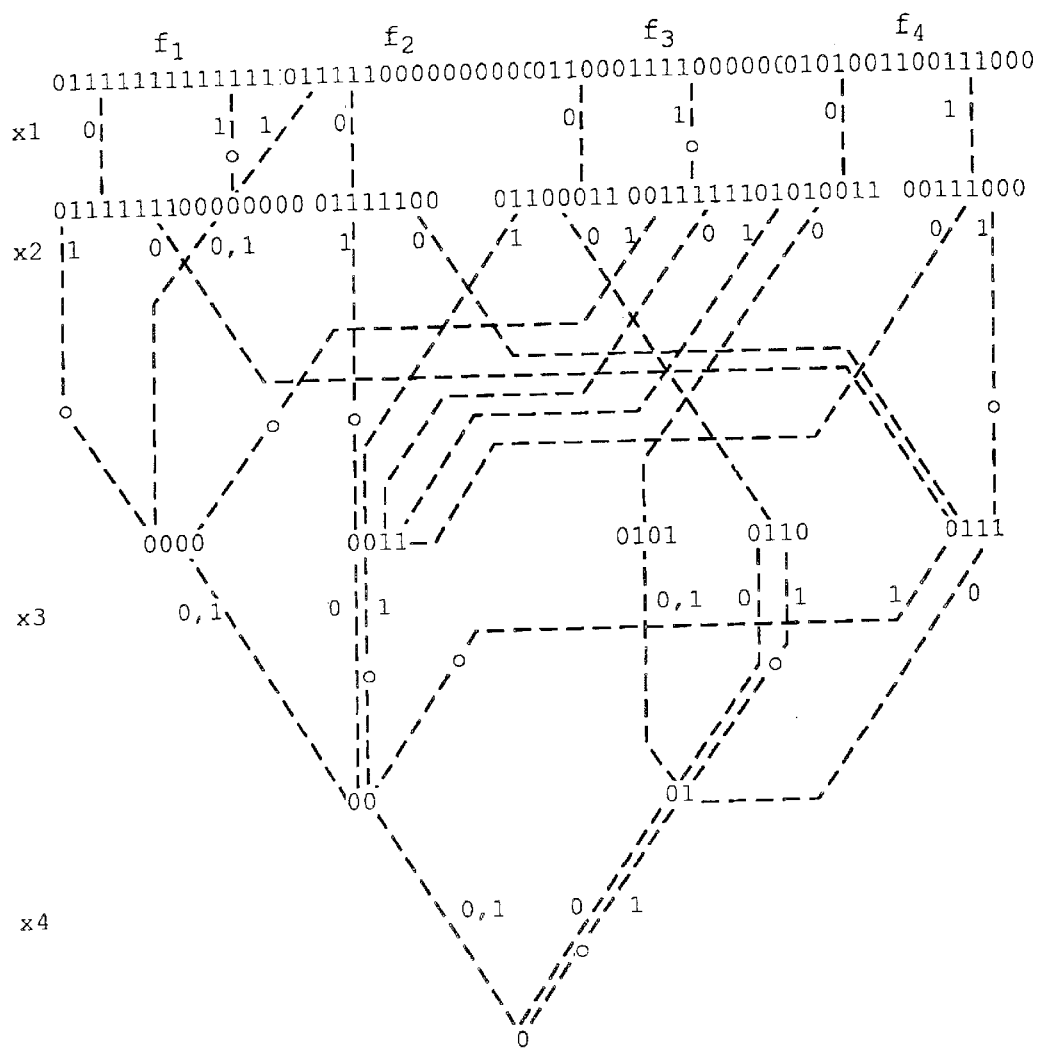
BDD for 4-bit Approximation of 1/(1+x)
FIG._2

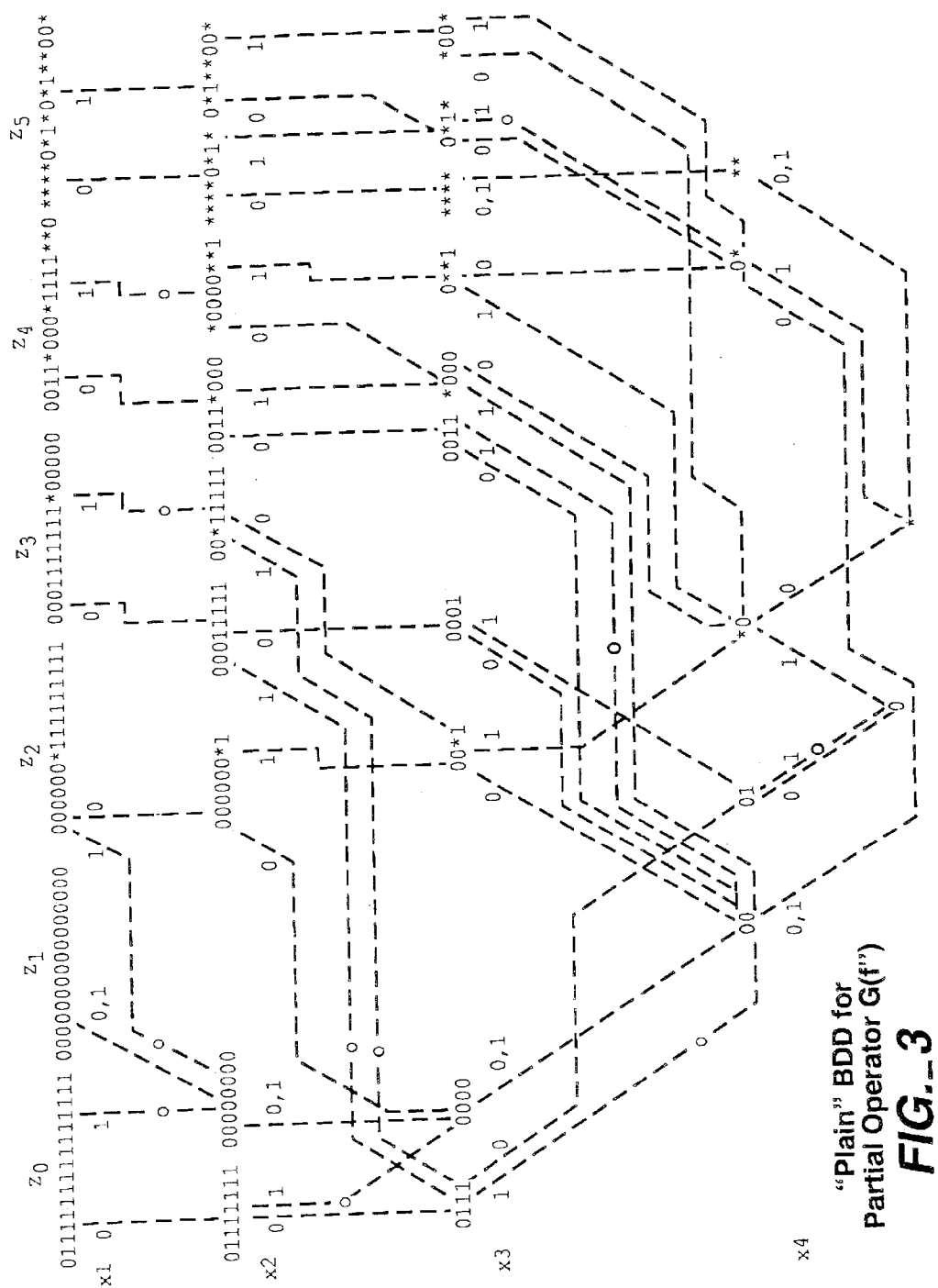
"Plain" BDD for Partial Operator G(f")
FIG._3

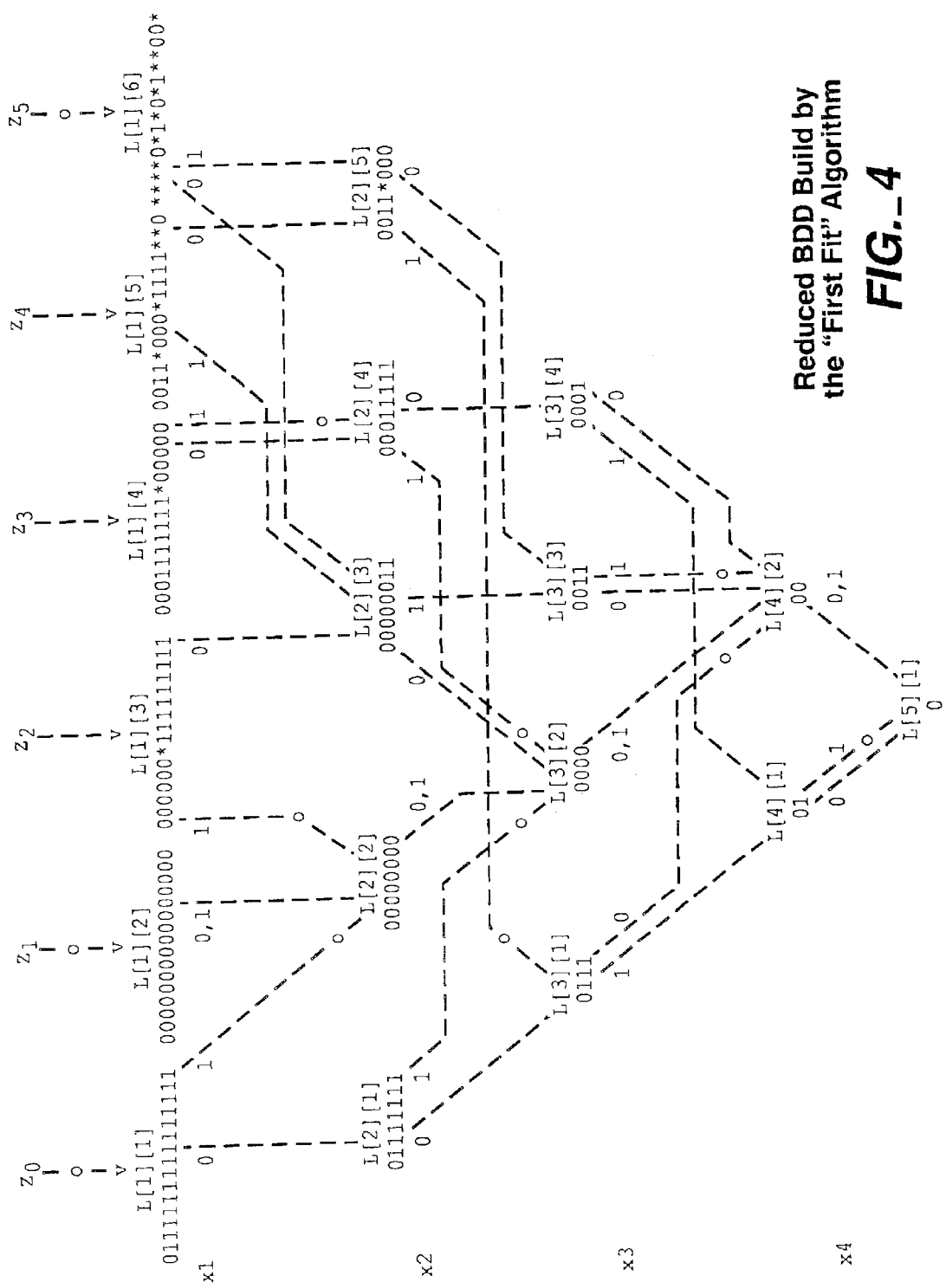
FIG._4 Reduced BDD Build by the "First Fit" Algorithm

EFFECTIVE APPROXIMATED CALCULATION OF SMOOTH FUNCTIONS

CROSS REFERENCE TO RELATED APPLICATION

The present application claims priority under 35 U.S.C. §119(e) to U.S. Provisional Patent Application No. 60/389,237, filed Jun. 13, 2002, which is herein incorporated by reference in its entirety.

FIELD OF THE INVENTION

The present invention generally relates to the field of integrated circuit design, and particularly to the design of integrated circuits employing smooth functions through the use of approximated calculation of smooth functions.

BACKGROUND OF THE INVENTION

Because the complexity of integrated circuits, such as an application specific integrated circuit (ASIC), system on a chip (SOC), general purpose integrated circuits, and the like, is increasing on a daily basis, the design of a circuit has become even more complex. One way of addressing this complexity is to mathematically describe the integrated circuit, so that the design may be instantiated and manipulated in an efficient manner. For instance, an information handling system may be configured by a program of instructions to describe a design of an integrated circuit, and then enable an operator of the information handling system to manipulate the design in an efficient manner. However, if the function, structure and connectivity cannot be described mathematically, then that structure may not be provided in a system in this nature.

For instance, in various integrated circuits, it is necessary to perform calculations of "smooth" functions. Typically, this calculation may only be performed with a limited accuracy, and, in some cases, effective implementations of "f" do not use the algebraic definition of "f" but are based on direct application to "f" general synthesis techniques, like Binary Decision Diagram (BDD) expansion. However, BDDs based on smooth functions may be needlessly complicated, thereby resulting in the waste of integrated circuit resources, which may further increase the cost of design and production of the product.

Therefore, it would be desirable to provide a system and method for design of integrated circuits employing smooth functions through the use of approximated calculation of smooth functions.

SUMMARY OF THE INVENTION

Accordingly, the present invention is directed to a system and method for effective approximation of smooth functions. In an aspect of the present invention, a method for approximating a smooth function for implementation in an integrated circuit design includes receiving a function f for computation with an accuracy of m bits by an integrated circuit. The argument x may be represented in a form of a fixed-point number with n binary digits. The function is computed based on an operator with one more output than the accuracy of m bits, so that F': $(x_1 x_2 \ldots x_N) \rightarrow (f_1 f_2 \ldots f_M f_{M+1})$. A value of f' is determined by choosing from one of the at least two numbers $f'_1(x)=2^{-M-1} [2^{M+1} f(x)]$ and $f'_2(x)=2^{-M-1} [2^{M+1} f(x)+1]$. The value is chosen based on complexity issues in the construction of a binary decision diagram for use in designing the integrated circuit.

In an additional aspect of the present invention, a system for designing an integrated circuit, the integrated circuit designed to perform smooth functions, includes a memory for storing a program of instructions and a processor communicatively coupled to the memory. The processor is suitable for performing the program of instructions which configures the processor to receive a function f for computation with an accuracy of m bits by an integrated circuit design, with argument x represented in a form of a fixed-point number with n binary digits. The function f is computed based on an operator with one more output than the accuracy of m bits, so that the function is computed as an m+1 digit approximation of the function f. A value of f' is determined by choosing the value from one of at least two numbers computed as an m+1 digit approximation of the function f, wherein the value is chosen based on complexity issues in the construction of a binary decision diagram for use in designing the integrated circuit.

In a further aspect of the present invention, a method for approximating a smooth function for implementation in an integrated circuit design includes receiving a function f for computation with an accuracy of m bits by an integrated circuit, with argument x represented in a form of a fixed-point number with n binary digits. The function is computed based on an operator with one more output than the accuracy of m bits, so that F': $(x_1 x_2 \ldots x_N) (f_1 f_2 \ldots f_M f_{M+1})$. A value of f' is determined for inclusion in a binary decision diagram for the function f, wherein an exact value of f' is not determined by the function f itself, but chosen from one of the at least two numbers $f'_1(x)=2^{-M-1} [2^{M+1} f(x)]$ and $f'_2(x)=2^{-M-1} [2^{M+1} f(x)+1]$. The value is chosen based on complexity issues in the construction of a binary decision diagram for use in designing the integrated circuit. a binary decision diagram based on the chosen values and a netlist is constructed utilizing the created binary decision diagram.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is an illustration of an exemplary binary decision diagram;

FIG. 2 is an illustration of an exemplary binary decision diagram for a 4-bit approximation of a function 1/(1+x);

FIG. 3 is an illustration of an exemplary "plain" binary decision diagram for a partial operator G(f''); and FIG. 4 is an illustration of a reduced binary decision diagram built utilizing a "first fit" algorithm.

DETAILED DESCRIPTION OF THE INVENTION

Reference will now be made in detail to the presently preferred embodiments of the invention, examples of which are illustrated in the accompanying drawings.

Referring generally now to FIGS. 1 through 4, exemplary embodiments of the present invention are shown. The construction and implementation of integrated circuit designs is an intensive and complicated process. With the complexity of integrated circuits increasing on a daily basis, the design of a circuit has become even more complex. One way of addressing this complexity is to mathematically describe the integrated circuit, so that the design may be instantiated and manipulated in an efficient manner. For instance, an information handling system may be configured by a program of instructions to describe a design of an integrated circuit, and then enable an operator of the information handling system to manipulate the design in an efficient manner. However, if the function, structure and connectivity cannot be described mathematically, then that structure may not be provided in a system in this nature.

In various integrated circuits, such as an application specific integrated circuit (ASIC) and the like, it is necessary to perform calculations of the form t=f(x) or t=f(x, y), where f is a "smooth" function (usually representable in the form of algebraic expression of a row). Typically, this calculation may only be performed with a limited accuracy, and, in some cases, effective implementations of "f" are not those ones which use the algebraic definition of "f" (because it may sometimes require a multiplicity of arithmetical modules like adders, multipliers, and the like), but rather are based on direct application to "f" of general synthesis techniques, like Binary Decision Diagram (BDD) expansion.

The present invention provides an optimization which may help to make the constructed BDDs simpler, such as by having fewer nodes, than in straightforward approach. For example, let argument and value of a function f(x) belong to the segment [0, 1] (to simplify the present discussion), and let x be represented in the form of fixed-point number with N binary digits after the decimal:

$x=0.x_1 x_2 \ldots x_N$

Let f(x) be computed with an accuracy of "M bits". A straightforward approach leads to binary operator $F: (x_1 x_2 \ldots x_N) \rightarrow (f_1 f_2 \ldots f_M)$, where $f=0.f_1 f_2 \ldots f_M$ is M-digit approximation to f(x), usually such that $f <= f(x) < f+2^{-M}$ (or, $f=2^{-M} [2^M f(x)]$, where [x] is the integer part (floor) of x).

Then, in designing an integrated circuit having the function, F may be considered as a "black box" with N inputs and M outputs, and expanded into netlist using general technique of BDDs.

The proposed approach of the present invention is based on operator with one more output:

$F': (x_1 x_2 \ldots x_N) \rightarrow (f_1 f_2 \ldots f_M f_{M+1})$, where the value $f'(x)=0.f_1 f_2 \ldots f_M f_{M+1}$ also is an approximation of f(x) with the same accuracy, i.e.

$$f'(x)<=f(x)<f'(x)+2^{-M} \qquad \text{equation (1)}$$

but the exact value of f' is not limited to determination by the function f itself, but rather may be chosen from among two numbers:

$f'_1(x)=2^{-M-1} [2^{M+1} f(x)]$ $f'_2(x)=2^{-M-1} [2^{M+1} f(x)+1]$

Further, the choice of which number to employ may be driven by complexity issues, such as scope and complexity of a BDD and an integrated circuit which was designed based on the BDD.

It should be noted by a person of ordinary skill in the art that $f'_1(x)<=f(x)<f'_1(x)+2^{-M-1}$ $f'_2(x)-2^{-M-1}<=f(x)<f'_2(x)$ and, if it is determined that f"(x) equals f'1(x) or f'2(x), but it is not known as to which one (the choice may be different for different values of x), then $$f''(x)-2^{-M-1}<=f(x)<f''(x)+2^{-M-1} \qquad \text{equation (2)}$$

So, for possible values of f(x), an interval of the length $2^{-M}$ is still available, that is, the same accuracy as in equation (1) is preserved, with the ability to make choices depending on complexity issues in the design of a circuit.

Thus, any given f may be approximated (with accuracy (2)) by $2^N$ different functions f". However, the different functions may have different implementation complexity. A BDD-based algorithm will now be described which generates both a function f" and its implementation.

An algorithm as implemented by the present invention may be described using the following illustrative example. Let N=M=4, and f(x)=1/(1+x). Then functions f'$_1$ and f'$_2$ have the following tabular definitions ($x=0.x_1 x_2 x_3 x_4$; $f=f_0.f_1 f_2 f_3 f_4 f_5$):

| X | | | | f | | | | | f'$_1$ | | | | | | f'$_2$ | | | | | |
|---|---|---|---|---|---|---|---|---|---|---|---|---|---|---|---|---|---|---|---|---|
| bits 1 | 2 | 3 | 4 | 0 | 1 | 2 | 3 | 4 | 0 | 1 | 2 | 3 | 4 | 5 | 0 | 1 | 2 | 3 | 4 | 5 |
| 0 | 0 | 0 | 0 | 1 | 0 | 0 | 0 | 0 | 1 | 0 | 0 | 0 | 0 | 0 | 1 | 0 | 0 | 0 | 0 | 1 |
| 0 | 0 | 0 | 1 | 0 | 1 | 1 | 1 | 1 | 0 | 1 | 1 | 1 | 1 | 0 | 0 | 1 | 1 | 1 | 1 | 1 |
| 0 | 0 | 1 | 0 | 0 | 1 | 1 | 1 | 0 | 0 | 1 | 1 | 1 | 0 | 0 | 0 | 1 | 1 | 1 | 0 | 1 |
| 0 | 0 | 1 | 1 | 0 | 1 | 1 | 0 | 1 | 0 | 1 | 1 | 0 | 1 | 0 | 0 | 1 | 1 | 0 | 1 | 1 |
| 0 | 1 | 0 | 0 | 0 | 1 | 1 | 0 | 0 | 0 | 1 | 1 | 0 | 0 | 1 | 0 | 1 | 1 | 0 | 1 | 0 |
| 0 | 1 | 0 | 1 | 0 | 1 | 1 | 0 | 0 | 0 | 1 | 1 | 0 | 0 | 0 | 0 | 1 | 1 | 0 | 0 | 1 |
| 0 | 1 | 1 | 0 | 0 | 1 | 0 | 1 | 1 | 0 | 1 | 0 | 1 | 1 | 1 | 0 | 1 | 1 | 0 | 0 | 0 |
| 0 | 1 | 1 | 1 | 0 | 1 | 0 | 1 | 1 | 0 | 1 | 0 | 1 | 1 | 0 | 0 | 1 | 0 | 1 | 1 | 1 |
| 1 | 0 | 0 | 0 | 0 | 1 | 0 | 1 | 0 | 0 | 1 | 0 | 1 | 0 | 1 | 0 | 1 | 0 | 1 | 1 | 0 |
| 1 | 0 | 0 | 1 | 0 | 1 | 0 | 1 | 0 | 0 | 1 | 0 | 1 | 0 | 0 | 0 | 1 | 0 | 1 | 0 | 1 |
| 1 | 0 | 1 | 0 | 0 | 1 | 0 | 0 | 1 | 0 | 1 | 0 | 0 | 1 | 1 | 0 | 1 | 0 | 1 | 0 | 0 |
| 1 | 0 | 1 | 1 | 0 | 1 | 0 | 0 | 1 | 0 | 1 | 0 | 0 | 1 | 0 | 0 | 1 | 0 | 0 | 1 | 1 |
| 1 | 1 | 0 | 0 | 0 | 1 | 0 | 0 | 1 | 0 | 1 | 0 | 0 | 1 | 0 | 0 | 1 | 0 | 0 | 1 | 1 |
| 1 | 1 | 0 | 1 | 0 | 1 | 0 | 0 | 0 | 0 | 1 | 0 | 0 | 0 | 1 | 0 | 1 | 0 | 0 | 1 | 0 |
| 1 | 1 | 1 | 0 | 0 | 1 | 0 | 0 | 0 | 0 | 1 | 0 | 0 | 0 | 1 | 0 | 1 | 0 | 0 | 1 | 0 |
| 1 | 1 | 1 | 1 | 0 | 1 | 0 | 0 | 0 | 0 | 1 | 0 | 0 | 0 | 0 | 0 | 1 | 0 | 0 | 0 | 1 |

BDDs are constructed in an embodiment of the present invention with "free negations", i.e. in the BDDs functions G and NOT G may share the same node. As shown in FIG. 1, a sample BDD is described wherein each node is marked by the table of function, if "o" is associated with the node, the corresponding subfunction must be inverted.

This BDD corresponds to the following implementation (signs "!", "&", "l" mean "NOT", "AND", "OR"):

g=!x1 & g11 l x1 & !g12 g11=!x2 & g21 l x2 & g22 g12=!x2&g21 l x2&g23 g21=!x3 & g31 l x3 & g31 g22=!x3 & g31 l x3 & !g31 g23=!x3 & g32 l x3 & g31 g31=!x4 & 0 l x4 & !0 g32=!x4 & 0 l x4 & 0

To start comparison, a kind of BDD is constructed for original function f (in this BDD). Bit f0 is simply a negation of f1. Thus, the four functions as shown in FIG. 2 are used as a starting point, in which a BDD for a 4-bit approximation of 1/(1+x) is shown.

That is, the BDD of the present invention for the function f has 4+7+5+2+1=19 nodes. Some of the nodes represent the same subfunction, like 0, 00, 0000 and 00000000; or 0101 and 01; but the number of these nodes is in general relatively small.

For the given function f, any function f" has the following table:

| 1 | 0 | 0 | 0 | 0 | * |
|---|---|---|---|---|---|
| 0 | 1 | 1 | 1 | 1 | * |
| 0 | 1 | 1 | 1 | 0 | * |
| 0 | 1 | 1 | 0 | 1 | * |
| 0 | 1 | 1 | 0 | 0 | * |
| 0 | 1 | * | * | * | * |
| 0 | 1 | 0 | 1 | 1 | * |
| 0 | 1 | 0 | 1 | * | * |
| 0 | 1 | 0 | 1 | 0 | * |
| 0 | 1 | 0 | * | * | * |
| 0 | 1 | 0 | 0 | 1 | * |
| 0 | 1 | 0 | 0 | 1 | * |
| 0 | 1 | 0 | 0 | * | * |
| 0 | 1 | 0 | 0 | * | * |
| 0 | 1 | 0 | 0 | 0 | * |

Bits marked "*" may vary, but under some restrictions: if there are multiple *s in the same row, then the actual values of the left-most "*" must differ from all others. To avoid these dependencies, it is convenient to deal with one of Gray codes, namely $G(y_1, \ldots, y_M) = (z_1, \ldots, z_M)$ where $z_1 = y_1$, $z_2 = y_1 + y_2$, $z_3 = y_2 + y_3$, ..., $z_M = y_{M-1} + y_M$ ("+" means XOR, or modulo 2 addition). Operator G may be inverted:

$G^{-1}(z_1, \ldots, z_M) = (y_1, \ldots, y_M)$ where $y_1 = z_1$, $y_2 = y_1 + z_2$, $y_3 = y_2 + z_3$, ..., $y_M = y_{M-1} + z_M$.

It should be noted, that both operators G and $G^{-1}$ have small complexity, and $G^{-1}$ may be implemented with small (logarithmic) depth or delay.

The main property of Gray codes is that the codes map representation of any two sequential binary numbers into two rows of bits such that they are almost identical (only one bit differs). Then, composition G(f") of Gray code and function f" will have the following table:

| $z_0$ | $z_1$ | $z_2$ | $z_3$ | $z_4$ | $z_5$ |
|---|---|---|---|---|---|
| 1 | 1 | 0 | 0 | 0 | * |
| 0 | 1 | 0 | 0 | 0 | * |
| 0 | 1 | 0 | 0 | 1 | * |
| 0 | 1 | 0 | 1 | 1 | * |
| 0 | 1 | 0 | 1 | * | 1 |
| 0 | 1 | 0 | 1 | 0 | * |
| 0 | 1 | * | 1 | 0 | 0 |
| 0 | 1 | 1 | 1 | 0 | * |
| 0 | 1 | 1 | 1 | * | 1 |
| 0 | 1 | 1 | 1 | 1 | * |
| 0 | 1 | 1 | * | 1 | 0 |
| 0 | 1 | 1 | 0 | 1 | * |
| 0 | 1 | 1 | 0 | 1 | * |
| 0 | 1 | 1 | 0 | * | 1 |
| 0 | 1 | 1 | 0 | * | 1 |
| 0 | 1 | 1 | 0 | 0 | * |

At this point, all *s may be chosen independently from each other through use of the present invention. That is, implementation of G(f") is a classical synthesis problem for partial functions or operators (that is, functions or operators with "don't care" values).

A BDD for the partial operator Z(x) is created. At the beginning, M+1 nodes are associated with $z_0 \ldots z_M$ (maybe negated, if the first non-* bit is 1). Referring now to FIG. 3, a "Plain" BDD for partial operator G(f") is shown.

As shown in FIG. 3, this BDD has 6+9+10+5+2=32 nodes. Again, "*" means "don't care", that is, the asterisks may be replaced by 0s or 1s in the most convenient way, preferably in such a way that may reduce the number of different nodes. To make this replacement, a variety of different algorithms may be utilized. One possible algorithm is the "first fit" method, that is, the BDD may be analyzed from top to bottom and from left to right.

DEFINITION. Let A and B be strings of the same length with elements 0, 1, or *. The string may be combined, if there exists string S of the same length without *s, such that each of A, B may be produced from S by replacing some elements by *s and/or inverting all non-* positions.

Notation: CMB(A, B). Examples: CMB(00, 01)=FALSE, CMB(00,11)=TRUE, CMB(00, 0*)=TRUE, CMB (00, *1)= TRUE, CMD(0*1, 1*0)=TRUE, CMD(*0*1, *1*1)= FALSE.

DEFINITION. Let $N \geq 1$, $A_1 \ldots A_N$ be strings such that all CMB($A_i$, $A_j$)=TRUE. We will say that (0, 1, *)-string S (of the same length as $A_i$) is derived from $A_1 \ldots A_N$, if all the following properties hold:

1) CMB($A_i$, S)=TRUE for all i;
2) S has maximum possible number of *s (that is, it has * only in those positions where all $A_i$ have *);
3) The first (from left to right) non-* position of S contains value 0.

Notation: S=DRV($A_1, \ldots, A_N$). Examples: DRV(0)=0, DRV(1)=0, DRV(*)=*, DRV(0, 1)=0, DRV(1, 1)=0, DRV(0, *)=0, DRV(*, *)=*, DRV(0*, *1)=00, DRV(01**, *0*1)=01*0, DRV(00***, *01, 01*, ***00)=00100.

Algorithm "First Fit" for Constructing BDD of a Partial Operator.

An algorithm utilizing "first fit" for constructing a BDD of a partial operation will now be described. The inputs include a partial operator $P(x_1, \ldots, x_N) = (y_1, \ldots, y_M)$, represented in tabular form, i.e. each element $y_i$ is described by a string S[i] of the length $2^N$ consisting of 0s, 1s and *s.

Begin of the algorithm "first fit"

---

L[1] := empty set
Loop for i = 1 ... N
. TRYADD(L[1], S[i])
End loop
Loop for n = 1 ... M
. L[n] := empty set
. Loop for i = 1 ... size of 1[n-1]
. . TRYADD(L[n], first half of the string L[n-1][i])
. . TRYADD(L[n], second half of the string L[n-1][i])
. End loop
End loop
End of the algorithm "first fit"

---

Here a subalgorithm TRYADD(L, S) has been utilized:

---

Input: (0, 1, *)-string S
Input/output: set L of (0, 1, *)-strings
(All strings in L and the string S must be of the same length).
Begin of TRYADD
    Loop for each element E of the set L
    . If CMB(S, E) = TRUE then
    . . replace x by DRV(E, S)
    . . exit from the algorithm TRYADD
    . End if
    End loop
    Add DRV(S) to the set L
End of TRYADD

---

The following discussion will describe how this algorithm may be applied to the same partial operator G(f″). Input strings S[0]. . . S[5] are:

1000000000000000
000000*111111111
0001111111*00000
0011*000*1111**0
****1*0*1*0**11*

Constructing L[1]:

S[0]=1000000000000000 goes to L[1] as L[1][1]= 0111111111111111 (i.e., negated)
S[1]=1111111111111111 goes to L[1] as L[1][2]= 0000000000000000 (i.e., negated)
S[2]=000000*111111111 goes to L[1] as L[1][3]= 000000*111111111
S[3]=0001111111*00000 goes to L[1] as L[1][4]= 0001111111*00000
S[4]=0011*000*1111**0 goes to L[1] as L[1][5]= 0011*000*1111**0
S[5]=****1*0*1*0**11* goes to L[1] as L[1][6]= ****0*1*0*1**00* (i.e., negated)

---

That is, L[1] = {
0111111111111111
0000000000000000
000000*111111111
0001111111*00000
0011*000*1111**0
****0*1*0*1**00*
}

Constructing L[2]:

---

L[1][1].head =   01111111 goes to L[2] as L[2][1] = 01111111
L[1][1].tail =   11111111 goes to L[2] as L[2][2] = 00000000 (i. e., inverted)
L[1][2].head =   00000000: CMB(00000000, L[2][2]) = TRUE, so L[2][2] will be replaced by DRV(00000000, L[2][2]) = 00000000 (actually, no changes in L[2])
                 (Later, similar situations will be referred to as follows: "no changes due to L[2][2]")
L[1][2].tail =   00000000: no changes due to L[2][2]
L[1][3].head =   000000*1 goes to L[2] as L[2][3] = 000000*1
L[1][3].tail =   11111111: no changes due to L[2][2]
L[1][3].head =   00011111 goes to L[2] as L[2][4] = 00011111
L[1][4].tail =   11*00000: no changes due to L[2][4]
L[1][5].head =   0011*000 goes to L[2] as L[2][5] = 0011*000
L[1][5].tail =   *1111**0: no changes due to L[2][3]
L[1][6].head =   ****0*1*: CMB(****0*1*, L[2][3]) = TRUE, so L[2][3] will be replaced by DRV(****0*1*, L[2][3]) = 00000011
                 (Note that this is a change.)
L[1][6].tail =   0*1**00*: no changes due to L[2][5]
  That is, L[2] = {
   01111111
   00000000
   00000011
   00011111
   0011*000
  }
(Originally there were nine nodes included on this level, as shown in FIG. 3).
  Constructing L[3]:
L[2][1].head =   0111 goes to L[3] as L[3][1] = 0111
L[2][1].tail =   1111 goes to L[3] as L[3][2] = 0000 (i. e., inverted)
L[2][2].head =   0000: no changes due to L[3][2]
L[2][2].tail =   0000: no changes due to L[3][2]
L[2][3].head =   0000: no changes due to L[3][2]
L[2][3].tail =   0011 goes to L[3] as L[3][3] = 0011
L[2][4].head =   0001 goes to L[3] as L[3][4] = 0001
L[2][4].tail =   1111: no changes due to L[3][2]
L[2][5].head =   0011: no changes due to L[3][3]

-continued

```
L[2][5].tail =        *000: no changes due to L[3][1]
    That is, L[3] = {
        0111
        0000
        0011
        0001
        }
(Originally, there were ten nodes included on this level, as shown in FIG. 3).
    Constructing L[4]:
L[3][1].head =     01 goes to L[4] as L[4][1] = 01
L[3][1].tail =     11 goes to L[4] as L[4][2] = 00 (i. e., inverted)
L[3][1].head =     00: no changes due to L[4][2]
L[3][1].tail =     00: no changes due to L[4][2]
L[3][1].head =     00: no changes due to L[4][2]
L[3][1].tail =     11: no changes due to L[4][2]
L[3][1].head =     00: no changes due to L[4][2]
L[3][1].tail =     01: no changes due to L[4][1]
    That is, L[4] = { 01 00 } (Originally, there were 5 nodes on this level, as shown in
FIG. 3).
    Finally, constructing L[5]:
L[4][1].head =     0 goes to L[5] as L[5][1] = 0
L[4][1].tail =     1: no changes due to L[5][1]
L[4][1].head =     0: no changes due to L[5][1]
L[4][1].tail =     0: no changes due to L[5][1]
```

Thus, the total number of nodes, elements of all sets $L[i]$, is $6+5+4+2+1=18$, that is, less than the number of nodes for the original function.

During construction of these sets, "connectivity information" may be maintained. For instance, which elements of $L[i+1]$ correspond to an element of $L[i]$, and whether negation will be used or not in each particular case. This connectivity information will be utilized to draw the BDD, as shown in the reduced BDD built by the "first fit" algorithm as shown in FIG. 4.

It should be noted that the BDD was not constructed for partial function G(f''), but rather for one of possible extensions of this operator. Compare:

Original G(f'') Operator, given by BDD on FIG. 4

1000000000000000 1000000000000000
000000*111111111 00000011111111111
0001111111*00000 00011111111100000
0011*000*1111**0 00111000111111100
****1*0*1*0**11* 1111111110011000111

And after applying $G^{-1}$ (to return to the original functions):
1000000000000000 1000000000000000
0111111111111111 0111111111111111
011111*000000000 0111110000000000
011000*111*00000 0110001111100000
0101*0*1*0*11**0 0101101100011100

The table below compares sizes of BDDs for some classical functions: $1/(x+1)$, $x^2$, sqrt(x), sin (x), all mapping [0,1) into [0,1), if both x and value are approximated with the N-bit accuracy: $x=0.x_1 \ldots x_N$; $f=f_0.f_1 \ldots f_N$ (or $f_0.f_1 \ldots f_{N+1}$ for the proposed approach), for the following three implementations:

(a) function f "as is"
(b) Gray code G(f)
(c) the proposed approach (The case (b) shows that Gray code itself reduces number of nodes, but the effect of the approach of the present invention is much greater).

| F. | 1/(x + 1) Method | | | X² Method | | | sqrt(x) Method | | | sin(x) Method | | |
|---|---|---|---|---|---|---|---|---|---|---|---|---|
| N = | a | b | c | a | b | c | a | b | c | a | b | c |
| 3 | 10 | 11 | 10 | 12 | 11 | 11 | 12 | 12 | 10 | 13 | 11 | 12 |
| 4 | 19 | 19 | 18 | 20 | 19 | 19 | 21 | 20 | 20 | 24 | 20 | 21 |
| 5 | 34 | 31 | 31 | 36 | 32 | 34 | 40 | 36 | 33 | 41 | 34 | 37 |
| 6 | 59 | 53 | 53 | 62 | 57 | 60 | 66 | 60 | 64 | 72 | 57 | 59 |
| 7 | 98 | 87 | 88 | 107 | 99 | 101 | 121 | 102 | 102 | 122 | 99 | 101 |
| 8 | 176 | 150 | 145 | 188 | 172 | 172 | 207 | 177 | 175 | 207 | 167 | 171 |
| 9 | 310 | 257 | 236 | 331 | 292 | 286 | 358 | 303 | 285 | 353 | 288 | 275 |
| 10 | 536 | 444 | 398 | 566 | 500 | 469 | 607 | 513 | 483 | 596 | 491 | 454 |
| 11 | 930 | 759 | 666 | 967 | 862 | 775 | 1054 | 897 | 792 | 1000 | 824 | 750 |
| 12 | 1599 | 1275 | 1100 | 1674 | 1475 | 1265 | 1800 | 1530 | 1317 | 1712 | 1402 | 1229 |
| 13 | 2721 | 2195 | 1798 | 2871 | 2519 | 2090 | 3082 | 2613 | 2166 | 2925 | 2403 | 2009 |
| 14 | 4649 | 3769 | 2924 | 4919 | 4336 | 3387 | 5281 | 4496 | 3565 | 4963 | 4046 | 3267 |
| 15 | 7941 | 6421 | 4736 | 8474 | 7407 | 5659 | 9007 | 7647 | 5832 | 8403 | 6906 | 5358 |
| 16 | 13524 | 10925 | 7698 | 14544 | 12714 | 9047 | 15366 | 13054 | 9532 | 14257 | 11664 | 8670 |

As should be apparent to a person of ordinary skill in the art, the system and method of the present invention may be generalized to function with multiple variables without departing from the spirit and scope of the present invention. This generalization has only one significant difference from the case of 1-variable functions: complexity of BDD may depend on the order of variables, and therefore, it would be desirable to choose the best order.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for approximating a smooth function for implementation in an integrated circuit design, comprising:

receiving a function f for computation with an accuracy of m bits by an integrated circuit, with argument x represented in a form of a fixed-point number with n binary digits;

computing the function based on an operator with one more output than the accuracy of m bits, so that
$F'$: $(x_1\ x_2\ \ldots\ x_N) \rightarrow (f_1\ f_2\ \ldots\ f_M\ f_{M+1})$; and determining a value of f by choosing from one of at least two numbers as follows
$f'_1(x) = 2^{-M-1} [2^{M+1} f(x)]$ and
$f'_2(x) = 2^{-M-1} [2^{M+1} f(x) + 1]$;

wherein the value is chosen based on complexity issues in the construction of a binary decision diagram for use in designing the integrated circuit.

2. The method as described in claim 1, further comprising creating a binary decision diagram based on the chosen values.

3. The method as described in claim 2, further comprising constructing a netlist utilizing the created binary decision diagram.

4. The method as described in claim 2, wherein the binary decision diagram is created utilizing free negations.

5. The method as described in claim 2, wherein the binary decision diagram utilizing the chosen values has fewer nodes than a binary decision diagram which was constructed without computing the function based on an operator with one more output than the accuracy of m bits.

6. The method as described in claim 1, wherein the function f has multiple variables.

7. The method as described in claim 6, wherein a binary decision diagram constructed from the function has the variables ordered in such a manner as to reduce complexity.

8. The method as described in claim 1, wherein a value $f'(x) = 0.f_1 f_2 \ldots f_M f_{M+1}$ is an approximation of $f(x)$ with the same accuracy of the received function, such that $f'(x) \leq f(x) < f'(x) + 2^{-M}$.

9. The method as described in claim 1, wherein an exact value of f' is not determined by the function f itself, but chosen from the two numbers.

10. A system for designing an integrated circuit, the integrated circuit designed to perform smooth functions, comprising:

a memory for storing a program of instructions; and a processor communicatively coupled to the memory, the processor suitable for performing the program of instructions, wherein the program of instructions configures the processor to receive a function f for computation with an accuracy of m bits by an integrated circuit design;

compute the function f based on an operator with one more output than the accuracy of m bits, so that the function is computed as an m+1 digit approximation of the function f; and determine a value of f' by choosing the value from one of at least two numbers computed as an m+1 digit approximation of the function f, wherein the value is chosen based on complexity issues in the construction of a binary decision diagram for use in designing the integrated circuit.

11. The system as described in claim 10, further comprising creating a binary decision diagram based on the chosen values.

12. The system as described in claim 11, further comprising constructing a netlist utilizing the created binary decision diagram.

13. The system as described in claim 11, wherein the binary decision diagram is created utilizing free negations.

14. The system as described in claim 11, wherein the binary decision diagram utilizing the chosen values has fewer nodes than a binary decision diagram which was constructed without computing the function based on an operator with one more output than the accuracy of m bits.

15. The system as described in claim 10, wherein the function f has multiple variables.

16. The system as described in claim 15, wherein a binary decision diagram constructed from the function has the variables ordered in such a manner as to reduce complexity.

17. The system as described in claim 10, wherein a value $f'(x)=0.f_1f_2\ldots f_Mf_{M+1}$ is an approximation of $f(x)$ with the same accuracy of the received function, such that $f'(x)<=f(x)<f'(x)+2^{-M}$.

18. The system as described in claim 10, wherein an exact value of f' is not determined by the function f itself, but chosen from the two numbers.

19. A method for approximating a smooth function for implementation in an integrated circuit design, comprising:

receiving a function f for computation with an accuracy of m bits by an integrated circuit, with argument x represented in a form of a fixed-point number with n binary digits;

computing the function based on an operator with one more output than the accuracy of m bits, so that
$F': (x_1\ x_2\ \ldots\ x_N) \rightarrow (f_1\ f_2\ \ldots\ f_M\ f_{M+1})$;

determining a value of f' to include in a binary decision diagram for the functions wherein an exact value of f' is not determined by the function f itself, but chosen from one of the at least two numbers $f'_1(x)=2^{-M-1}[2^{M+1}f(x)]$ and $f'_2(x)=2^{-M-1}[2^{M+1}f(x)+1]$, wherein the value is chosen based on complexity issues in the construction of a binary decision diagram for use in designing the integrated circuit;

creating a binary decision diagram based on the chosen values; and constructing a netlist utilizing the created binary decision diagram.

20. The method as described in claim 19, wherein the binary decision diagram is created utilizing free negations.

21. The method as described in claim 19, wherein the binary decision diagram utilizing the chosen values has fewer nodes than a binary decision diagram which was constructed without computing the function based on an operator with one more output than the accuracy of m bits.

22. The method as described in claim 19, wherein the function f has multiple variables.

23. The method as described in claim 22, wherein a binary decision diagram constructed from the function has the variables ordered in such a manner as to reduce complexity.

24. The method as described in claim 19, wherein a value $f'(x)=0.f_1f_2\ldots f_Mf_{M+1}$ is an approximation of $f(x)$ with the same accuracy of the received function, such that $f'(x)<=f(x)<f'(x)+2^{-M}$.

* * * * *